United States Patent
Mei

(10) Patent No.: US 11,588,480 B2
(45) Date of Patent: Feb. 21, 2023

(54) SWITCH MODE REGULATOR WITH SLEW RATE CONTROL

(71) Applicant: Texas Instruments Incorporated, Dallas, TX (US)

(72) Inventor: Tawen Mei, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 168 days.

(21) Appl. No.: 17/114,793

(22) Filed: Dec. 8, 2020

(65) Prior Publication Data

US 2021/0184561 A1 Jun. 17, 2021

Related U.S. Application Data

(60) Provisional application No. 62/946,613, filed on Dec. 11, 2019.

(51) Int. Cl.
| | |
|---|---|
| *H02M 3/158* | (2006.01) |
| *H03K 17/16* | (2006.01) |
| *H02M 1/088* | (2006.01) |
| *H02M 1/44* | (2007.01) |
| *H02M 1/00* | (2006.01) |
| *H02M 1/08* | (2006.01) |

(52) U.S. Cl.
CPC ......... *H03K 17/16* (2013.01); *H02M 1/0029* (2021.05); *H02M 1/08* (2013.01); *H02M 1/088* (2013.01); *H02M 1/44* (2013.01); *H02M 3/158* (2013.01); *H03K 17/163* (2013.01)

(58) Field of Classification Search
CPC ...... H02M 1/088; H02M 1/0029; H02M 1/08; H02M 1/44; H02M 1/0009; H02M 3/156; H02M 3/158; H03K 17/16; H03K 17/163
See application file for complete search history.

(56) References Cited

U.S. PATENT DOCUMENTS

| | | | |
|---|---|---|---|
| 8,456,211 B2 * | 6/2013 | Chen | H03K 5/04 327/170 |
| 8,633,736 B2 * | 1/2014 | Illegems | H03K 17/08104 327/108 |
| 8,786,360 B2 * | 7/2014 | Ang | G05F 3/262 327/108 |
| 9,778,672 B1 * | 10/2017 | Gao | G05F 1/575 |
| 10,425,075 B1 * | 9/2019 | Consoer | H02M 1/088 |
| 10,429,867 B1 * | 10/2019 | Kim | G05F 1/575 |
| 10,545,523 B1 * | 1/2020 | Wu | G05F 1/565 |

* cited by examiner

*Primary Examiner* — Thienvu V Tran
*Assistant Examiner* — Shahzeb K Ahmad
(74) *Attorney, Agent, or Firm* — Charles F. Koch; Frank D. Cimino

(57) ABSTRACT

A circuit is configured to drive a switch mode regulator and to control the slew rate at a switching terminal of the regulator. The circuit includes first and second transistors coupled between a voltage supply terminal and a switching terminal, and includes third and fourth transistors coupled between the voltage supply terminal and the switching terminal. The circuit includes a fifth transistor coupled to the fourth transistor in a current mirror configuration and a sixth transistor coupled between the voltage supply terminal and the third transistor. The circuit includes a first resistor coupled between the voltage supply terminal and the fifth transistor, and includes a second resistor coupled between the sixth transistor and the second transistor.

27 Claims, 2 Drawing Sheets

SWITCH MODE REGULATOR WITH SLEW RATE CONTROL

CROSS-REFERENCE TO RELATED APPLICATION

This application claims priority to U.S. Provisional Application No. 62/946,613, filed Dec. 11, 2019, which is hereby incorporated by reference herein.

TECHNICAL FIELD

This description relates generally to switch mode regulators.

BACKGROUND

In switch mode regulators (e.g., buck regulator, boost regulator), the voltage at a switching terminal transitions between an input voltage and a voltage at a ground terminal. As a result, electromagnetic interference (EMI) is generated at the switching terminal. The EMI is correlated to the slew rate dV/dt of the voltage at the switching terminal. If the slew rate is too high, then the resulting EMI is high. But if the slew rate is too slow, then the efficiency of the regulator suffers.

SUMMARY

In one aspect, a circuit is configured to drive a switch mode regulator and control the slew rate at a switching terminal of the regulator. The circuit includes first and second transistors coupled between a voltage supply terminal and the switching terminal and includes third and fourth transistors coupled between the voltage supply terminal and the switching terminal. The circuit includes a fifth transistor coupled to the fourth transistor in a current mirror configuration and a sixth transistor coupled between the voltage supply terminal and the third transistor. The circuit includes a first resistor coupled between the voltage supply terminal and the fifth transistor, and includes a second resistor coupled between the sixth transistor and the second transistor.

In an additional aspect, the first transistor is a PFET, and the second transistor is an NFET. The PFET has a source coupled to the voltage supply terminal, and the NFET has a source coupled to the switching terminal. The PFET and NFET have respective drains coupled together, and the PFET and NFET have respective gates. The third transistor is a PFET, and the fourth transistor is an NFET. The PFET has a source coupled to the voltage supply terminal, and the NFET has a source coupled to the switching terminal, and the PFET and NFET have respective drains coupled together. The PFET has a gate coupled to the gate of the first transistor and the NFET has a gate coupled to the NFET's drain. The fifth transistor is an NFET having a source coupled to the switching terminal and having a gate coupled to the gate of the fourth transistor and having a drain. The sixth transistor is a PFET having a source coupled to the voltage supply terminal and having a drain coupled to the gates of the first and third transistors and having a gate coupled to the drain of the fifth transistor.

In an additional aspect, the fifth transistor is configured to mirror the current through the fourth transistor, and respective currents through the first, third, fifth and sixth transistors are proportional to one other. The first resistor is configured to control a current through the first transistor, and the first resistor is configured to control the slew rate at the switching terminal.

In an additional aspect, a circuit includes first and second transistors coupled between a voltage supply terminal and a switching terminal, and includes third and fourth transistors coupled between the voltage supply terminal and the switching terminal. The circuit includes a fifth transistor coupled to the fourth transistor in a current mirror configuration, and includes a sixth transistor coupled between the voltage supply terminal and the third transistor. The circuit includes a seventh transistor coupled between an input voltage terminal and the switching terminal and coupled to the first and second transistor. The circuit includes a first resistor coupled between the voltage supply terminal and the fifth transistor and a second resistor coupled between the sixth transistor and the second transistor. The seventh transistor is configured to electrically connect the switching terminal to the input voltage terminal when the seventh transistor is on, and to electrically disconnect the switching terminal from the input voltage terminal when the seventh transistor is off.

In an additional aspect, a circuit includes first and second PFETs having respective sources coupled to a voltage supply terminal and having respective gates coupled together. The first and second PFETs have respective drains. The circuit includes a first NFET having a drain coupled to the drain of the first PFET and having a source coupled to a switching terminal and having a gate. The circuit includes a second NFET having a drain coupled to the drain of the second PFET and having a source coupled to the switching terminal and having a gate coupled to the drain. The circuit includes a third PFET having a source, a drain and a gate, in which the source is coupled to the voltage supply terminal, and the drain is coupled to the gates of the first and second PFETs. The circuit includes a third NFET having a drain coupled to the gate of the third PFET and having a source coupled to the switching terminal. The circuit includes a first resistor coupled between the voltage supply terminal and the drain of the third NFET and a second resistor coupled between the drain of the third PFET and the gate of the first NFET.

DETAILED DESCRIPTION

Figure 1:
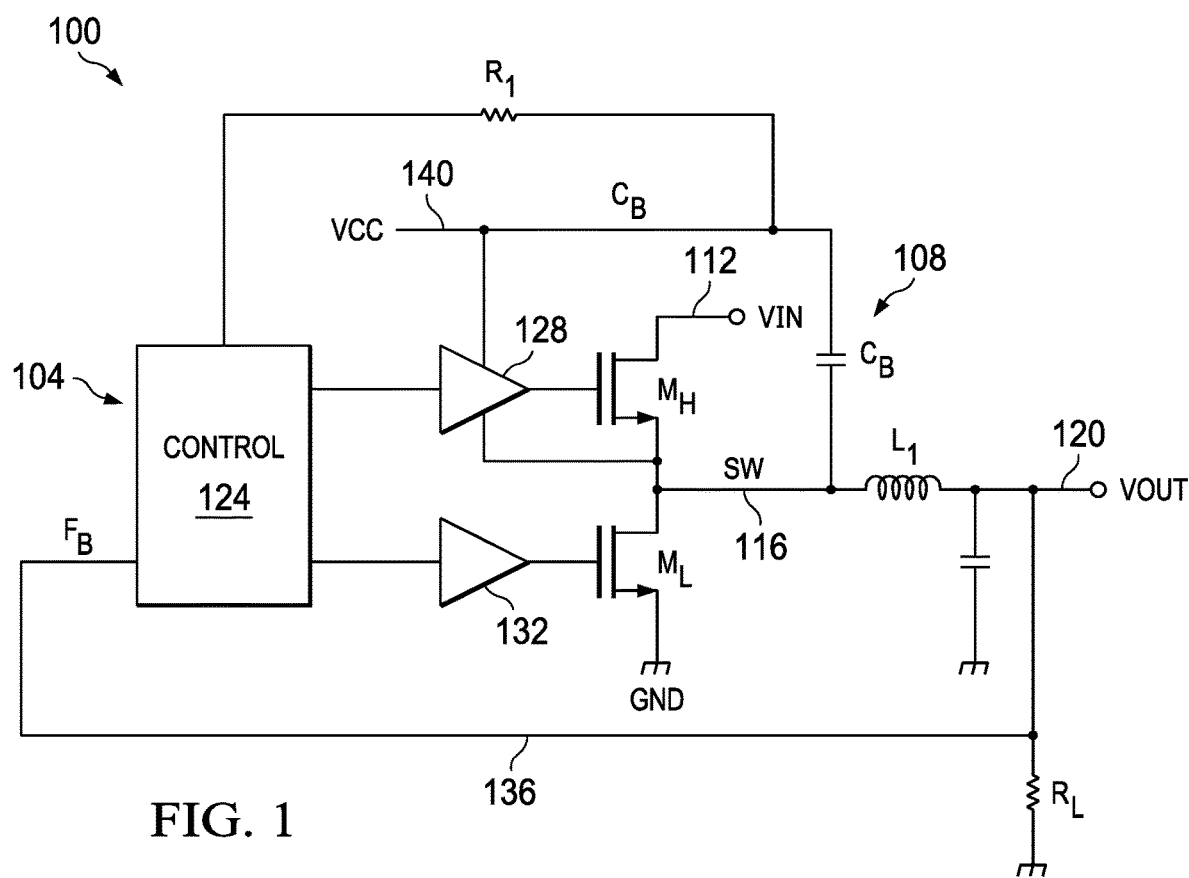
FIG. 1 is a block diagram of a switch mode regulator system of an example embodiment.

FIG. 1 is a block diagram of a switch mode regulator system 100 of an example embodiment. The system 100 includes a driver circuit 104 configured to drive a switch mode regulator, such as a buck regulator or a boost regulator.

The driver circuit 104 drives a buck regulator 108, which includes: (a) a high-side switch $M_H$ coupled between an input voltage terminal 112 and a switching terminal (or node) 116; and (b) a low-side switch $M_L$ coupled between the switching terminal 116 and a ground terminal. The input voltage terminal 112 may be coupled to an input voltage Vin.

The buck regulator 108 includes an inductor Li coupled between the switching terminal 116 and an output terminal 120. A capacitor Ci is coupled between the output terminal 120 and the ground terminal. Also, a load represented by the resistor $R_L$ is coupled between the output terminal 120 and the ground terminal.

The driver circuit 104 includes a control circuit 124, which provides control signals to a high-side driver 128 and a low-side driver 132. Responsive to the control signals, the high-side driver 128 controls the duty cycle of the high-side switch $M_H$, and the low-side driver 132 controls the duty cycle of the low-side switch $M_L$.

The control circuit 124 receives a feedback signal representative of an output voltage Vout at the output terminal 120 via a feedback loop 136. The feedback loop 136 may be coupled to the output terminal 120 or may be coupled to a voltage divider at the output terminal 120 (not shown in FIG. 1), which may provide a feedback signal representative of the output voltage Vout.

A capacitor $C_B$ is coupled between a voltage supply terminal 140 and the switching terminal 116. The voltage supply terminal 140 may be coupled to a voltage supply $V_{CC}$. The capacitor $C_B$ provides $V_{CC}$ to the high-side driver 128. The capacitor $C_B$ is coupled to the control circuit 124 via a first resistor $R_1$. As described below, the first resistor $R_1$ is configured to set the slew rate dV/dt at the switching terminal 116.

In operation, the high-side switch $M_H$ and the low-side switch $M_L$ are turned ON/OFF in a complementary manner. When $M_H$ is ON and $M_L$ is OFF, Vin is coupled to the switching terminal 116. As a result, the current in the inductor Li rises and flows into the load $R_L$, and the capacitor Ci is charged. When $M_H$ is OFF and $M_L$ is ON, the switching terminal 116 is coupled to the ground terminal. As a result, the current in the inductor Li falls, but continues to flow into the load $R_L$. During that time, the capacitor Ci supplies current to the load $R_L$ to compensate for the current demanded by $R_L$. Thus, when $M_L$ is ON, the capacitor Ci provides the current to compensate for the imbalance due to: (a) the fall in the current through the inductor Li; and (b) the current required to drive the load $R_L$.

Because MH and ML are operated in a complementary manner, the voltage at the switching node 116 transitions between Vin and a voltage at the ground terminal, thereby generating electromagnetic interference (EMI) and degrading the performance of the system 100. The EMI, which is generated at the switching terminal 116, is correlated to the slew rate dV/dt of the voltage at the switching terminal 116. If the slew rate is too fast, then the resulting EMI is high. But if the slew rate is too slow, then the efficiency of the buck regulator 108 suffers. As described below, the driver circuit 104 is configured to control the slew rate at the switching terminal 116.

Figure 2:
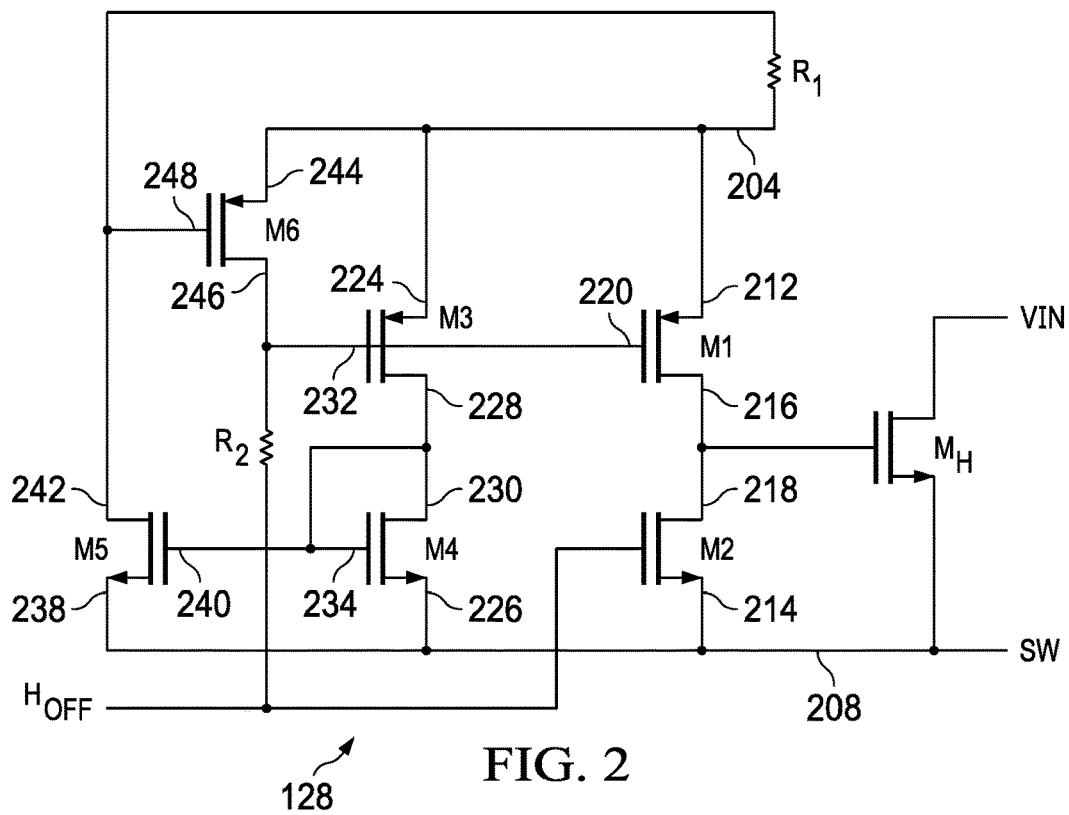
FIG. 2 is a schematic diagram of a driver of an example embodiment.

FIG. 2 is a schematic diagram of the driver 128 (or the driver 132). The driver 128 is configured to control the operation of the high-side switch $M_H$. The configuration and operation of the driver 132 are similar to the configuration and operation of the driver 128. The driver 128 includes first and second transistors, M1 and M2, coupled between a voltage supply terminal 204 and a switching terminal 208. The driver 128 also includes third and fourth transistors, M3 and M4, coupled between the voltage supply terminal 204 and the switching terminal 208. A fifth transistor M5 is coupled to the fourth transistor M4 in a current mirror configuration, and a sixth transistor M6 is coupled between the voltage supply terminal 204 and the third transistor M3.

In an example embodiment, the first transistor M1 is a p-channel field effect transistor (PFET), and the second transistor M2 is an n-channel field effect transistor (NFET). The transistor M1 has a source 212 coupled to the voltage supply terminal 204, and the transistor M2 has a source 214 coupled to the switching terminal 208. The transistors, M1 and M2, have respective drains 216 and 218, coupled together. The transistors, M1 and M2, have respective gates 220 and 222.

The third transistor M3 is a PFET, and the fourth transistor is an NFET. The transistor M3 has a source 224 coupled to the voltage supply terminal 204, and the transistor M4 has a source 226 coupled to the switching terminal 208. The transistors, M3 and M4, have respective drains 228 and 230, coupled together. The transistor M3 has a gate 232 coupled to the gate 220 of the transistor M1, and the transistor M4 has a gate 234 coupled to its drain 230.

The fifth transistor M5 is an NFET, which has: (a) a source 238 coupled to the switching terminal 208; (b) a gate 240 coupled to the gate 234 of the fourth transistor M4; and (c) a drain 242. The sixth transistor M6 is a PFET, which has: (a) a source 244 coupled to the voltage supply terminal 204; and (b) a drain 246 coupled to the gates 220 and 232 of the first and third transistors, M1 and M3. The transistor M6 has a gate 248 coupled to the drain 242 of the transistor M5. A resistor R1 is coupled between the voltage supply terminal 204 and the drain 242 of the transistor M5. Another resistor R2 is coupled between the drain 246 of the transistor M6 and the gate 222 of the transistor M2.

Because the sources 212 and 224 are coupled together and the gates 220 and 232 are coupled together, the drain currents of the transistors M1 and M3 are proportional and related to their sizes. The drain current of the transistor M3 is equal to the drain current of the transistor M4. Because the transistors M4 and M5 are coupled together in a current mirror configuration, the drain current of the transistor M4 is mirrored by the transistor M5. Also, because the resistor R1 conducts the drain current of the transistor M5, the voltage drop across the resistor R1 is proportional to the drain current of the transistor M5. Thus, the drain current of the transistor M5 is proportional to the drain current of the transistor M1.

For example, in operation, if the drain current of the transistor M1 falls, then the voltage drop across R1 also falls, thereby causing the drain current of the transistor M6 to decrease. As a result, the current through the resistor R2 falls, thereby causing the voltage across the resistor R2 to decrease. As the voltage drop across R2 falls, the voltage drop between the gate 220 and the source 212 rises, thereby causing the drain current of the transistor M1 to rise. Thus, if the drain current of the transistor M1 falls, then the voltage drop across the resistor R2 also falls, thereby causing the drain current of the transistor M1 to rise. As a result, the high-side switch $M_H$ is turned ON faster, thereby causing the slew rate dV/dt at the switching node 208 to increase.

Conversely, if the drain current of the transistor M1 rises, then the voltage drop across the resistor R1 also rises, thereby causing the drain current of the transistor M6 to also rise. As a result, the voltage drop across the resistor R2 increases, thereby causing the voltage drop between the gate 220 and the source 212 to decrease. Thus, the drain current of the transistor M1 falls, thereby causing the high-side switch $M_H$ to turn ON slowly, which causes the slew rate dV/dt at the switching node 208 to decrease.

By varying the value of the resistor R1, the drain current of the transistor M1 can be varied, which allows regulation of the slew rate dV/dt at the switching terminal 208. To turn OFF the switch $M_H$, the gate 222 is driven HIGH by applying a signal $H_{OFF}$, thereby causing the transistor M2 to turn ON. As a result, the gate 260 of the switch $M_H$ is coupled to its source 262, thereby causing the switch $M_H$ to turn OFF.

In one aspect, the transistors M1, M2, M3, M4, M5 and M6 operate as a closed-loop circuit, which regulates the slew rate at the switching terminal 208. If the drain current of the transistor M1 falls, then the current through the resistor R2 also falls, thereby causing the transistor M1 to turn ON faster. If the drain current of the transistor M1 rises, then the current through the resistor R2 also rises, thereby causing the transistor M1 to turn ON slower. By controlling the drain current of the transistor M1, the slew rate at the switching node 208 is controlled, which allows control of the EMI.

Figure 3:
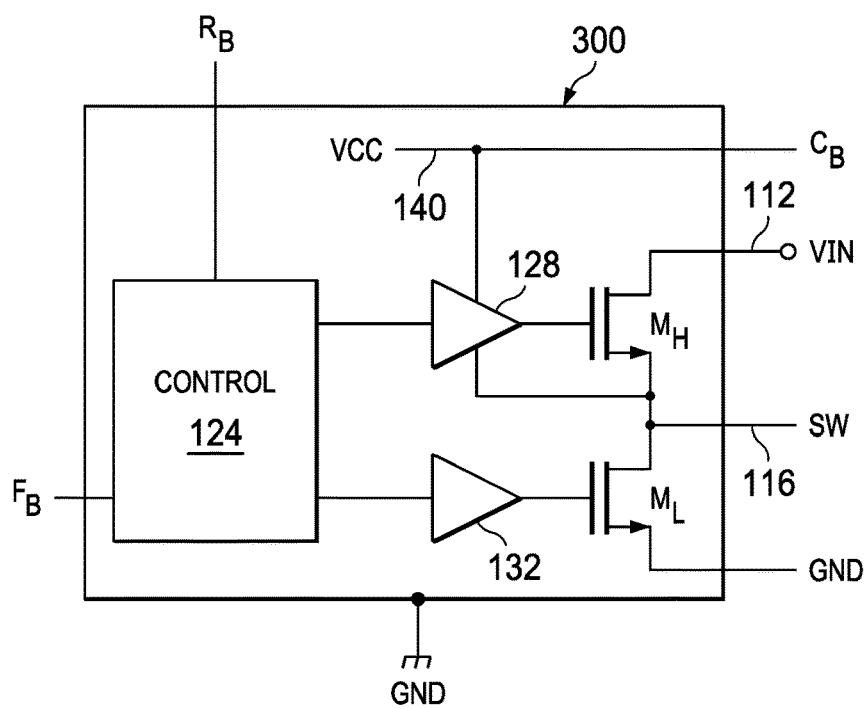
FIG. 3 is a schematic diagram of an integrated circuit (IC) of an example embodiment.

In an example embodiment, the control circuit 124, the high-side driver 128, the low-side driver 132, and the switches $M_H$ and $M_L$ are implemented in an integrated circuit (IC) 300 as shown in FIG. 3. The switches $M_H$ and $M_L$ are coupled to form the switching terminal 116, which is accessible externally via a pin SW. The resistor $R_1$ (shown in FIG. 2) can be externally coupled between two pins RB and CB. A pin VIN can be coupled to the input voltage, and a pin FB can be coupled to the output voltage Vout (shown in FIG. 2). The slew rate at the switching terminal 116 is adjusted by selecting a suitable value of the resistor $R_1$.

Modifications are possible in the described embodiments, and other embodiments are possible, within the scope of the claims.

What is claimed is:

1. A circuit comprising:
    first and second transistors coupled between a voltage supply terminal and a switching terminal, in which the first and second transistors have respective gates;
    third and fourth transistors coupled between the voltage supply terminal and the switching terminal, in which the third and fourth transistors have respective gates;
    a fifth transistor, in which the fifth transistor is an NFET having a source, a gate and a drain, the source is coupled to the switching terminal, and the gate of the fifth transistor is coupled to the gate of the fourth transistor;
    a sixth transistor, in which the sixth transistor is a PFET having a source, a gate and a drain, the source is coupled to the voltage supply terminal, the drain is coupled to the gates of the first and third transistors, and the gate of the sixth transistor is coupled to the drain of the fifth transistor;
    a first resistor coupled between the voltage supply terminal and the fifth transistor; and
    a second resistor coupled between the sixth transistor and the second transistor.

2. The circuit of claim 1, wherein the first transistor is a PFET, the second transistor is an NFET, the PFET has a source coupled to the voltage supply terminal, the NFET has a source coupled to the switching terminal, the PFET and NFET have respective drains coupled together, and the PFET and NFET have respective gates.

3. The circuit of claim 1, wherein the third transistor is a PFET, the fourth transistor is an NFET, the PFET has a source coupled to the voltage supply terminal, the NFET has a source coupled to the switching terminal, the PFET and NFET have respective drains coupled together, the PFET has a gate coupled to the gate of the first transistor, and the NFET has a gate coupled to the NFET's drain.

4. The circuit of claim 1, wherein the fifth transistor is configured to mirror a current through the fourth transistor.

5. The circuit of claim 1, wherein respective currents through the first, third, fifth and sixth transistors are proportional to one other.

6. The circuit of claim 1, wherein the first resistor is configured to control a current through the first transistor.

7. The circuit of claim 1, wherein the first resistor is configured to control a slew rate at the switching terminal.

8. The circuit of claim 1, wherein the circuit is configured to transition the switching terminal to a logic low voltage responsive to a logic high voltage at the gate of the second transistor.

9. The circuit of claim 1, wherein the circuit is configured to transition the switching terminal to a logic high voltage responsive to the first transistor being on.

10. A circuit comprising:
    first and second transistors coupled between a voltage supply terminal and a switching terminal, in which the first and second transistors have respective gates;
    third and fourth transistors coupled between the voltage supply terminal and the switching terminal, in which the third and fourth transistors have respective gates;
    a fifth transistor, in which the fifth transistor is an NFET having a source, a gate and a drain, the source is coupled to the switching terminal, and the gate of the fifth transistor is coupled to the gate of the fourth transistor;
    a sixth transistor, in which the sixth transistor is a PFET having a source, a gate and a drain, the source is coupled to the voltage supply terminal, the drain is coupled to the gates of the first and third transistors, and the gate of the sixth transistor is coupled to the drain of the fifth transistor;
    a seventh transistor coupled between an input voltage terminal and the switching terminal and coupled to the first and second transistors;
    a first resistor coupled between the voltage supply terminal and the fifth transistor; and
    a second resistor coupled between the sixth transistor and the second transistor;
    in which the seventh transistor is configured to: electrically connect the switching terminal to the input voltage terminal when the seventh transistor is on; and electrically disconnect the switching terminal from the input voltage terminal when the seventh transistor is off.

11. The circuit of claim 10, wherein the first transistor is a PFET, the second transistor is an NFET, the PFET has a source coupled to the voltage supply terminal, the NFET has a source coupled to the switching terminal, the PFET and NFET have respective drains coupled together, and the PFET and NFET have respective gates.

12. The circuit of claim 10, wherein the third transistor is a PFET, the fourth transistor is an NFET, the PFET has a source coupled to the voltage supply terminal, the NFET has a source coupled to the switching terminal, the PFET and NFET have respective drains coupled together, the PFET has a gate coupled to the gate of the first transistor, and the NFET has a gate coupled to the NFET's drain.

13. The circuit of claim 10, wherein the fifth transistor is configured to mirror a current through the fourth transistor.

14. The circuit of claim 10, wherein respective currents through the first, third, fifth and sixth transistors are proportional to one other.

15. The circuit of claim 10, wherein the first resistor is configured to control a current through the first transistor.

16. The circuit of claim 10, wherein the first resistor is configured to control a slew rate at the switching terminal.

17. A circuit comprising:
first and second transistors coupled between a voltage supply terminal and a switching terminal, in which the first and second transistors have respective gates;
third and fourth transistors coupled between the voltage supply terminal and the switching terminal, in which the third and fourth transistors have respective gates;
a fifth transistor coupled to the fourth transistor in a current mirror configuration;
a sixth transistor coupled between the voltage supply terminal and the third transistor;
a seventh transistor, in which the seventh transistor is an NFET having a drain, a source and a gate, the drain is coupled to an input voltage terminal, the source is coupled to the switching terminal, and the gate of the seventh transistor is coupled to the source of the first transistor;
a first resistor coupled between the voltage supply terminal and the fifth transistor; and
a second resistor coupled between the sixth transistor and the second transistor;
in which the seventh transistor is configured to: electrically connect the switching terminal to the input voltage terminal when the seventh transistor is on; and electrically disconnect the switching terminal from the input voltage terminal when the seventh transistor is off.

18. The circuit of claim 17, wherein the seventh transistor is configured to: electrically connect the input voltage terminal to the switching terminal responsive to the first transistor turning on; and electrically disconnect the switching terminal from the input voltage terminal responsive to the second transistor turning on.

19. The circuit of claim 17, wherein the circuit is configured to: electrically connect the voltage supply terminal to the gate of the seventh transistor responsive to the first transistor turning on; and electrically disconnect the switching terminal from the input voltage terminal by coupling the gate and the source of the seventh transistor responsive to the second transistor turning on.

20. A circuit comprising:
first and second PFETs having respective sources, respective gates and respective drains, the respective sources coupled to a voltage supply terminal, and the respective gates coupled together;
a first NFET having a drain, a source and a gate, the drain coupled to the drain of the first PFET, and the source coupled to a switching terminal;
a second NFET having a drain, a source and a gate, the drain coupled to the drain of the second PFET, the source coupled to the switching terminal, and the gate coupled to the drain;
a third PFET having a source, a drain and a gate, the source coupled to the voltage supply terminal, and the drain coupled to the gates of the first and second PFETs;
a third NFET having a drain and a source, the drain coupled to the gate of the third PFET, and the source coupled to the switching terminal;
a first resistor coupled between the voltage supply terminal and the drain of the third NFET; and
a second resistor coupled between the drain of the third PFET and the gate of the first NFET.

21. The circuit of claim 20, further comprising a fourth NFET having a drain, a source and a gate, the drain coupled to an input voltage terminal, the source coupled to the switching terminal, and the gate coupled to the source of the first transistor.

22. The circuit of claim 20, wherein the fourth NFET is configured to: electrically connect the input voltage terminal to the switching terminal responsive to the first PFET turning on; and electrically disconnect the switching terminal from the input voltage terminal responsive to the first NFET turning on.

23. The circuit of claim 20, wherein the circuit is configured to: electrically connect the voltage supply terminal to the gate of the fourth NFET responsive to the first PFET turning on; and electrically disconnect the switching terminal from the input voltage terminal by coupling the gate and the source of the fourth NFET responsive to the first NFET turning on.

24. The circuit of claim 20, wherein the third NFET is configured to mirror a current through the second NFET.

25. The circuit of claim 20, wherein respective currents through the first PMOS, the second PMOS, the third NFET and the third PFET are proportional to one other.

26. The circuit of claim 20, wherein the first resistor is configured to control a current through the first PFET.

27. The circuit of claim 20, wherein the first resistor is configured to control a slew rate at the switching terminal.

* * * * *